(12) United States Patent
Tsai et al.

(10) Patent No.: US 11,169,434 B2
(45) Date of Patent: Nov. 9, 2021

(54) OPTICAL ENGINE MODULE AND PROJECTOR

(71) Applicant: Coretronic Corporation, Hsin-Chu (TW)

(72) Inventors: Te-Ying Tsai, Hsin-Chu (TW); Kun-Chieh Chan, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 90 days.

(21) Appl. No.: 16/855,989

(22) Filed: Apr. 22, 2020

(65) Prior Publication Data

US 2020/0341357 A1    Oct. 29, 2020

(30) Foreign Application Priority Data

Apr. 29, 2019   (CN) .......................... 201910352359.8

(51) Int. Cl.
*G03B 21/16*       (2006.01)
*G03B 21/14*       (2006.01)
(Continued)

(52) U.S. Cl.
CPC ......... *G03B 21/16* (2013.01); *G02B 27/0955* (2013.01); *G03B 21/142* (2013.01);
(Continued)

(58) Field of Classification Search
CPC .. G03B 21/16; G03B 21/142; H05K 7/20972; H04N 9/3144; H04N 9/3197;
(Continued)

(56) References Cited

U.S. PATENT DOCUMENTS 6,791,838 B1 * 9/2004 Hung .................. H01L 23/4006
165/185
6,816,375 B2 * 11/2004 Kalyandurg ...... G02F 1/133385
174/16.3
(Continued)

FOREIGN PATENT DOCUMENTS

CN         101008773        8/2007
CN         101859170        10/2010
(Continued)

OTHER PUBLICATIONS

Office Action of China Counterpart Application, dated Apr. 28, 2021, pp. 1-10.

*Primary Examiner* — Bao-Luan Q Le
(74) *Attorney, Agent, or Firm* — JCIPRNET

(57) ABSTRACT

An optical engine module includes a housing, an assembling element, a light valve and a first heat exchange assembly. The assembling element has an opening corresponding to an assembly hole of the housing and is assembled on the housing in a non-direct contact mode. The light valve includes a base and an imaging element. The base bears against the assembling element, and an imaging surface of the imaging element faces the opening. The housing, the assembling element and the light valve define a chamber. The first heat exchange assembly is disposed on the assembling element and includes at least one first heat conduction component and a first heat dissipation fin set. The first heat dissipation fin set is located outside the housing. The first heat conduction component extends from the assembling element to the outside of the housing and is connected with the first heat dissipation fin set.

20 Claims, 13 Drawing Sheets

(51) Int. Cl.
*H05K 7/20* (2006.01)
*H04N 9/31* (2006.01)
*G02B 27/09* (2006.01)

(52) U.S. Cl.
CPC ......... *H04N 9/3144* (2013.01); *H04N 9/3197* (2013.01); *H05K 7/20972* (2013.01)

(58) Field of Classification Search
CPC ............ G02B 27/0955; G02B 26/0833; G02B 26/0841; G02B 26/085; G02B 26/0858; G02B 26/0866
See application file for complete search history.

(56) References Cited

U.S. PATENT DOCUMENTS

| | | | | |
|---|---|---|---|---|
| 6,882,480 B2* | 4/2005 | Yanagisawa | ......... | H04N 9/3105 359/634 |
| 7,086,737 B2* | 8/2006 | Kitabayashi | ......... | G03B 21/005 353/31 |
| 7,130,136 B2* | 10/2006 | Fujimori | ............. | H04N 9/3141 359/820 |
| 7,152,982 B2* | 12/2006 | Kitabayashi | ....... | G02B 27/1013 353/119 |
| 7,175,283 B2* | 2/2007 | Kitabayashi | ........... | G03B 21/16 353/54 |
| 7,192,143 B2* | 3/2007 | Fujimori | ........... | G02F 1/133385 348/E9.027 |
| 7,216,987 B2* | 5/2007 | Fujimori | ................ | G03B 21/16 353/54 |
| 7,226,171 B2* | 6/2007 | Fujimori | ............. | H04N 9/3144 353/52 |
| 7,270,418 B2* | 9/2007 | Fujimori | ............. | H04N 9/3144 348/E9.027 |
| 7,275,833 B2* | 10/2007 | Saito | ................... | H01L 23/4006 257/E23.084 |
| 7,513,625 B2* | 4/2009 | Zakoji | .................... | G03B 21/16 353/119 |
| 7,660,124 B2* | 2/2010 | Chen | ................. | H05K 7/20472 361/719 |
| 7,798,651 B2* | 9/2010 | Wu | ........................ | G03B 21/16 353/52 |
| 7,938,543 B2 | 5/2011 | Gerets et al. | | |
| 8,083,355 B2* | 12/2011 | Yanagisawa | ......... | H04N 9/3144 353/54 |
| 9,128,426 B2 | 9/2015 | Fujimoto et al. | | |
| 10,082,665 B2* | 9/2018 | Hou | ..................... | G03B 21/008 |
| 10,365,547 B2* | 7/2019 | Chang | ...................... | G02B 5/08 |
| 10,718,999 B2* | 7/2020 | Hou | ....................... | G02B 7/181 |
| 2003/0058537 A1* | 3/2003 | Domroese | .......... | G02B 27/1026 359/487.04 |
| 2004/0150798 A1* | 8/2004 | Tsao | ..................... | G03B 21/008 353/75 |
| 2004/0174679 A1* | 9/2004 | Hung | .................. | H01L 23/4006 361/704 |
| 2005/0018151 A1* | 1/2005 | Kitabayashi | ........... | H04N 9/317 353/119 |
| 2005/0146689 A1* | 7/2005 | Iechika | ................. | G03B 21/208 353/97 |
| 2005/0162621 A1* | 7/2005 | Shirota | ................ | G02B 7/1805 353/81 |
| 2005/0168703 A1* | 8/2005 | Fujimori | .............. | H04N 9/3144 353/52 |
| 2005/0185142 A1* | 8/2005 | Fujimori | .............. | H04N 9/3144 353/30 |
| 2005/0195460 A1* | 9/2005 | Fujimori | ........... | G02F 1/133385 359/237 |
| 2005/0200813 A1* | 9/2005 | Kitabayashi | ......... | H04N 9/3144 353/20 |
| 2005/0265001 A1* | 12/2005 | Saito | ................... | H01L 23/4006 361/710 |
| 2006/0050252 A1* | 3/2006 | Hsu | .......................... | G03B 3/00 353/119 |
| 2006/0078266 A1* | 4/2006 | Wu | ..................... | G02B 27/0927 385/146 |
| 2006/0157230 A1* | 7/2006 | Kawahara | ............. | H01L 23/473 165/104.33 |
| 2006/0176453 A1* | 8/2006 | Miyamoto | ............. | G03B 21/16 353/119 |
| 2006/0197917 A1* | 9/2006 | Zakoji | .................... | G03B 21/16 353/54 |
| 2008/0174741 A1* | 7/2008 | Yanagisawa | ......... | H04N 9/3144 353/31 |
| 2008/0246923 A1* | 10/2008 | Wu | ........................ | G03B 21/16 353/52 |
| 2009/0135564 A1* | 5/2009 | Chen | .................. | H05K 7/20472 361/709 |
| 2011/0007284 A1* | 1/2011 | Robitaille | ............ | G03B 21/145 353/81 |
| 2017/0255006 A1* | 9/2017 | Hou | .................. | G03B 21/145 |
| 2018/0011392 A1 | 1/2018 | Utsunomiya | | |
| 2018/0356628 A1* | 12/2018 | Hou | ........................ | G02B 7/181 |
| 2019/0018307 A1* | 1/2019 | Chang | .................... | G03B 21/28 |

FOREIGN PATENT DOCUMENTS

| | | |
|---|---|---|
| CN | 106125474 | 11/2016 |
| CN | 106569376 | 4/2017 |
| CN | 106647121 | 5/2017 |
| CN | 106054508 | 3/2018 |
| CN | 108681192 | 10/2018 |
| CN | 209590515 | 11/2019 |
| JP | 2005043679 | 2/2005 |
| JP | 2006133409 | 5/2006 |
| TW | 201014355 | 4/2010 |
| TW | I559072 | 11/2016 |

* cited by examiner

OPTICAL ENGINE MODULE AND PROJECTOR

CROSS-REFERENCE TO RELATED APPLICATION

This application claims the priority benefit of China application serial no. 201910352359.8, filed on Apr. 29, 2019. The entirety of the above-mentioned patent application is hereby incorporated by reference herein and made a part of this specification.

BACKGROUND OF THE INVENTION

1. Field of the Invention

The present invention relates to an optical device and a projector, and particularly relates to an optical engine module and a projector with the optical engine module.

2. Description of Related Art

A projector converts an illuminating beam from a light source into an image beam by utilizing a light valve, converts the image beam into a projecting beam by utilizing a projection lens, and projects the projecting beam. With the increase of the projection brightness of the projector, heat generated during action of the light valve is correspondingly increased. To avoid overheating of the light valve, the heat dissipation efficiency of the light valve is increased by increasing the volume of a heat dissipation module and the rotation speed of a heat dissipation fan, and other modes. However, this action will greatly increase the volume of the projector and generate excessive noise. Furthermore, a heat dissipation module is only disposed at a rear end of the light valve, and a front end of the light valve cannot be subjected to effective heat dissipation, so that unexpected internal stress is caused due to excessive temperature difference between the front end of the light valve and the rear end of the light valve, and the service life of the light valve is reduced.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

The present invention is directed to an optical engine module, which improves a heat dissipation effect on a front end of a light valve.

The present invention is also directed to a projector, which includes the optical engine module and improves the heat dissipation effect on the front end of the light valve so as to obtain better projection quality.

Other objectives and advantages of the present invention may be further understood from the technical features disclosed in the present invention.

To achieve one, some, or all of the aforementioned objectives or other objectives, an embodiment of the present invention provides an optical engine module, which includes a housing, an assembling element, a light valve and a first heat exchange assembly. The housing has an assembly hole. The assembling element has an opening and is assembled on the housing in a non-direct contact mode, where the opening is corresponding to the assembly hole. The light valve is disposed on the assembling element and includes a base and an imaging element, where the imaging element includes an imaging surface. The base bears against the assembling element, and the imaging surface of the imaging element faces the opening of the assembling element. The housing, the assembling element and the light valve define a chamber. The first heat exchange assembly is disposed on the assembling element and includes at least one first heat conduction component and a first heat dissipation fin set. The first heat dissipation fin set is located outside the housing. The first heat conduction component extends from the assembling element to the outside of the housing and is connected with the first heat dissipation fin set.

To achieve one, some, or all of the aforementioned objectives or other objectives, an embodiment of the present invention provides a projector, which includes an illuminating system, an optical engine module and a lens. The illuminating system is used for providing an illuminating beam. The optical engine module includes a housing, an assembling element, a light valve and a first heat exchange assembly. The housing has an assembly hole. The assembling element has an opening and is assembled on the housing in a non-direct contact mode. The opening is corresponding to the assembly hole. The light valve is disposed on the assembling element and includes a base and an imaging element. The base bears against the assembling element, and the imaging element includes an imaging surface. The imaging surface of the imaging element faces the opening of the assembling element. The imaging element is located on a transmission path of the illuminating beam and is used for modulating the illuminating beam into an image beam. The housing, the assembling element and the light valve define a chamber. The first heat exchange assembly is disposed on the assembling element and includes at least one first heat conduction component and a first heat dissipation fin set. The first heat dissipation fin set is located outside the housing. The first heat conduction component extends from the assembling element to the outside of the housing and is connected with the first heat dissipation fin set. The lens is disposed on a transmission path of the image beam and is used for projecting the image beam out of the projector to form a projecting beam.

Based on the above, the embodiment of the present invention at least has one of the following advantages or effects. In the optical engine module of the invention, the assembling element is assembled on the housing in a non-direct contact mode, the base of the light valve bears against the assembling element, and the first heat exchange assembly is disposed on the assembling element. Therefore, heat transmission from the housing to the light valve can be reduced. Heat generated during action of the light valve can be transmitted to the outside by means of the assembling element and the first heat conduction component and the first heat dissipation fin set of the first heat exchange assembly, thereby effectively improving the heat dissipation effect on the front end of the light valve. Furthermore, the projector adopting the optical engine module of the invention has better projection quality.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be located in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
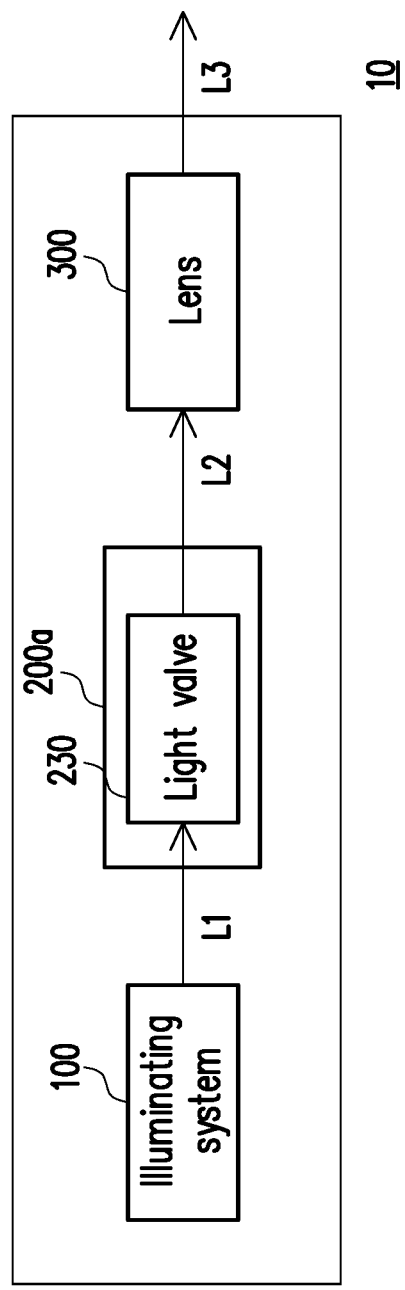
FIG. 1 is a schematic view of a projector according to an embodiment of the present invention.

FIG. 1 is a schematic view of a projector according to an embodiment of the invention. Firstly, referring to FIG. 1, a projector 10 according to this embodiment includes an illuminating system 100, an optical engine module 200a and a lens 300. The illuminating system 100 is used for providing an illuminating beam L1. The optical engine module 200a includes a light valve 230. The light valve 230 is located on a transmission path of the illuminating beam L1 and is used for modulating the illuminating beam L1 into an image beam L2. The lens 300 is a projection lens, is located on a transmission path of the image beams L2 and is used for projecting the image beam L2 out of the projector 10 to form a projecting beam L3.

Further, an excitation light source used by the illuminating system 100 of this embodiment is a laser diode (LD) light source for example, such as a laser diode bank. Specifically, all light sources meeting the volume requirements according to the actual design can be implemented, and the present invention is not limited thereto. The light valve 230 is a reflective light modulator for example, such as a liquid crystal on silicon panel (LCoS panel) or a digital micro-mirror device (DMD). In an embodiment, the light valve 230 is a penetrable light modulator for example, such as a transparent liquid crystal panel, an electro-optical modulator, a maganeto-optic modulator or an acousto-optic modulator (AOM), but this embodiment does not limit the type and variety of the light valve 230. The detailed steps and the implementation mode of a method for modulating an excitation beam and a conversion beam into an image beam by the light valve 230 can be adequately taught, suggested, implemented and explained by the general knowledge in the art, and therefore the descriptions thereof are omitted herein. In addition, the lens 300 includes, for example, a combination of one or more optical lenses with diopters, and includes, for example, various combinations of non-planar lenses of biconcave lenses, biconvex lenses, concave-convex lenses, convex-concave lenses, plano-convex lenses, plano-concave lenses and the like. In an embodiment, the lens 300 can further include a planar optical lens for projecting an image beam from the light valve 230 out of the projector 10 in a reflection or penetration mode to form a projecting beam. Herein, this embodiment does not limit the type and variety of the lens 300.

Figure 2A:
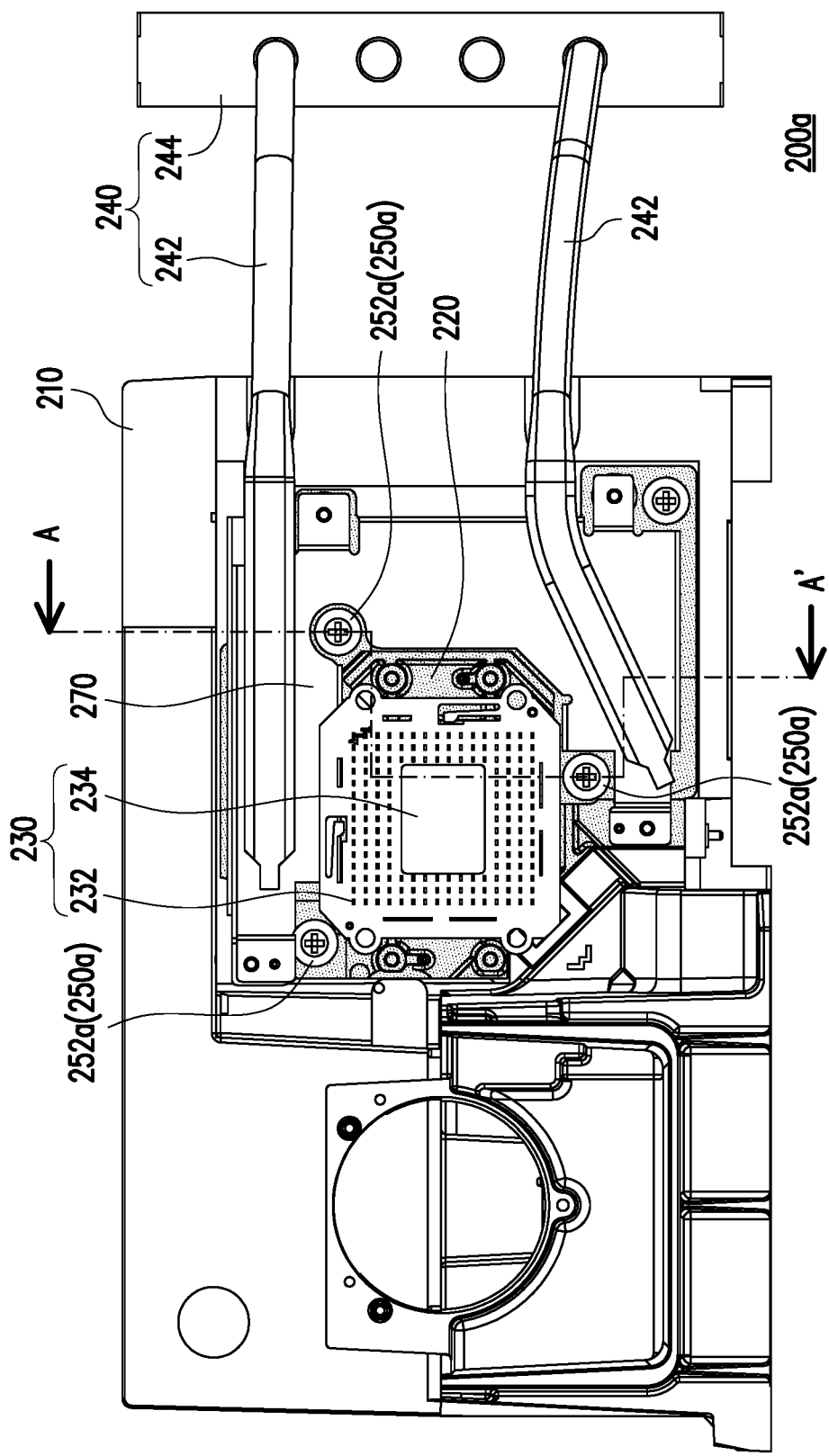
FIG. 2A is a top view of an optical engine module in FIG. 1.
Figure 2B:
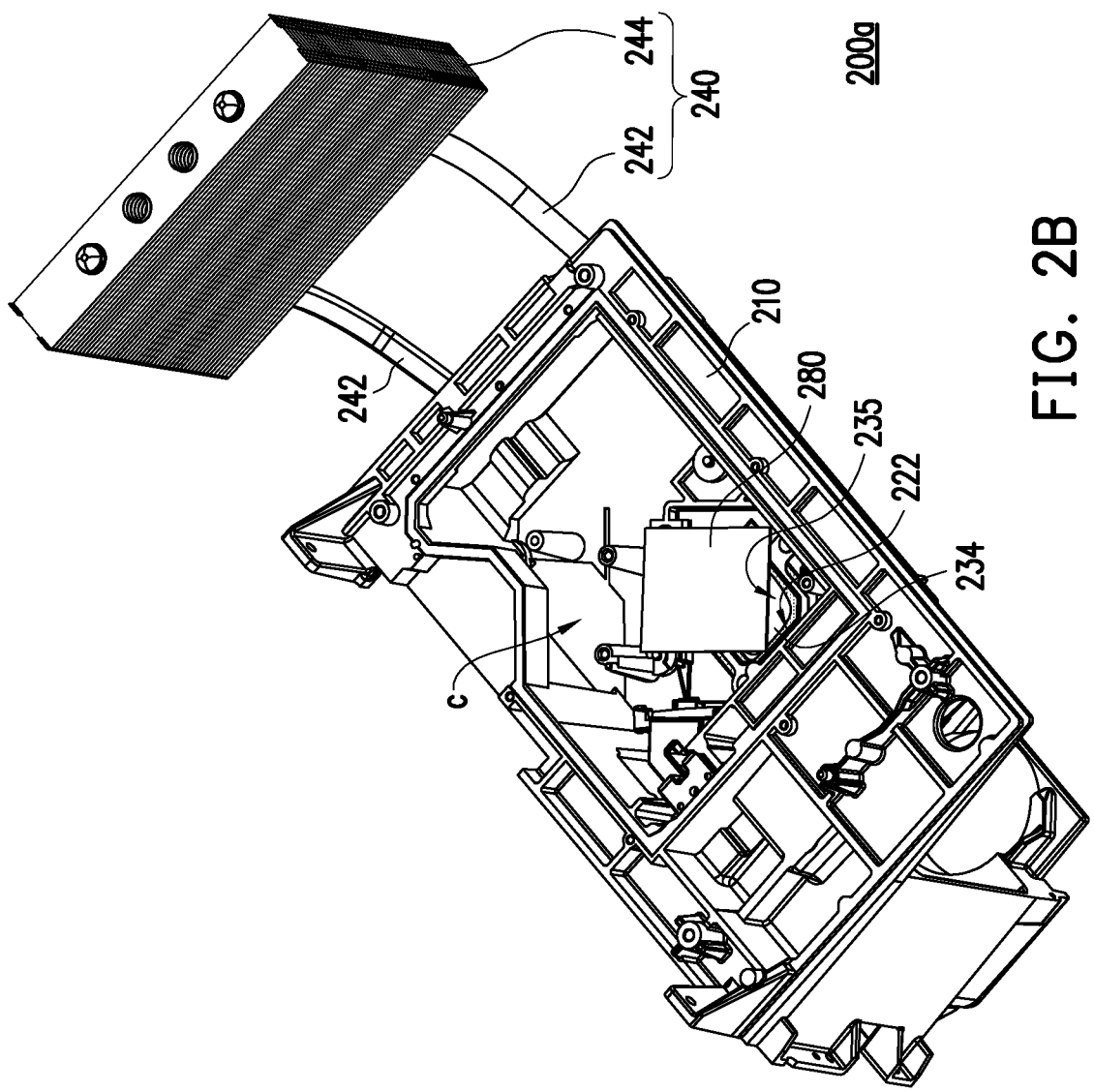
FIG. 2B is a three-dimensional bottom view of the optical engine module in FIG. 2A.
Figure 2C:
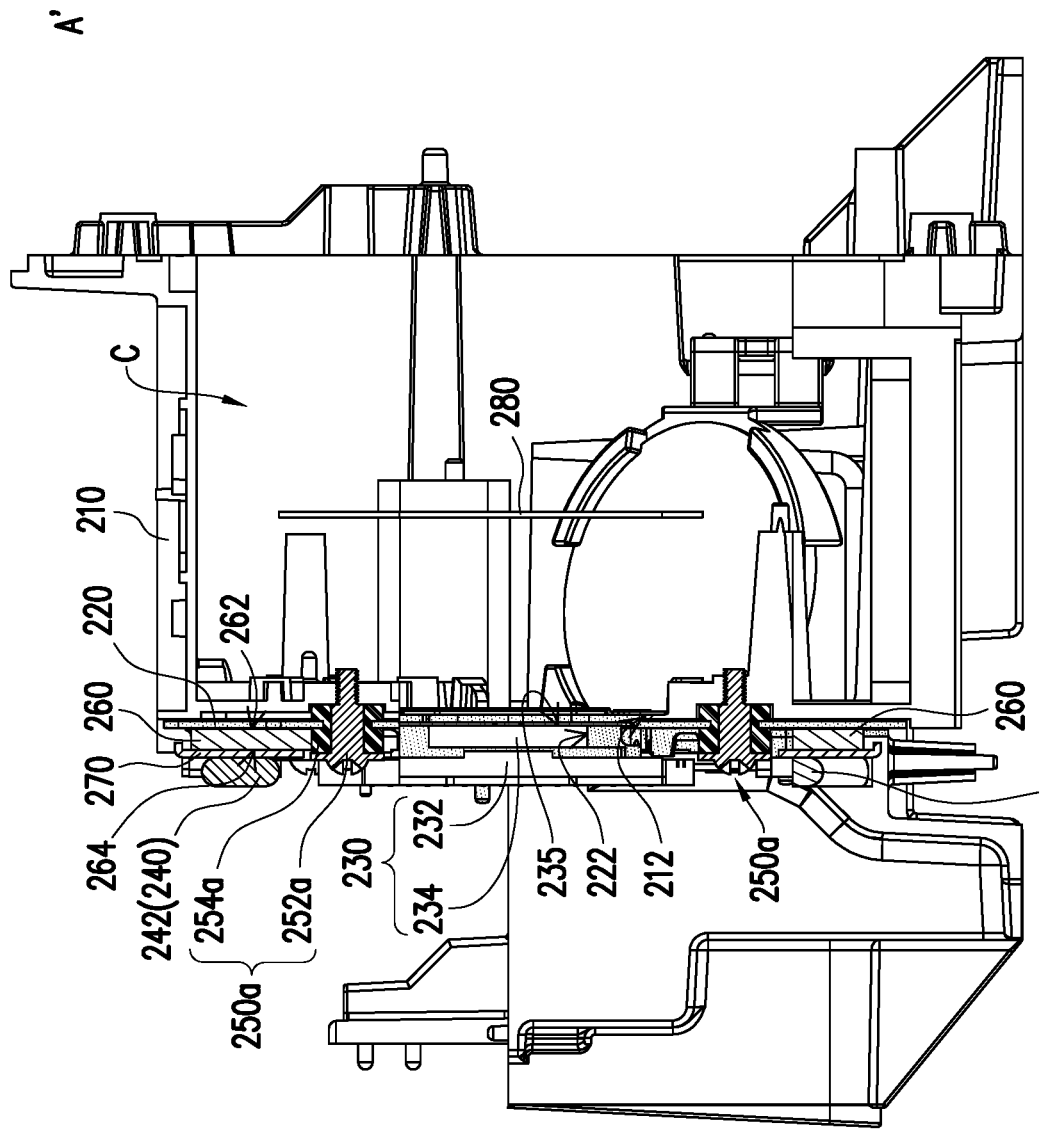
FIG. 2C is a cross-sectional view along a line A-A' in FIG. 2A.

FIG. 2A is a top view of the optical engine module in FIG. 1. FIG. 2B is a three-dimensional bottom view of the optical engine module in FIG. 2A. FIG. 2C is a cross-sectional view along a line A-A' in FIG. 2A. For convenience of explanation, a portion of a housing 210 is omitted in FIG. 2B.

Referring to all of FIG. 2A, FIG. 2B and FIG. 2C, the optical engine module 200a of this embodiment includes a housing 210, an assembling element 220, a light valve 230 and a first heat exchange assembly 240. The housing 210 has an assembly hole 212. The assembling element 220 has an opening 222, and the assembling element 220 is assembled on the housing 210 in a non-direct contact mode, where the opening 222 of the assembling element 220 is corresponding to the assembly hole 212 of the housing 210. In detail, the optical engine module 200a of this embodiment further includes at least one fixing assembly 250a (three fixing assemblies are schematically drawn), and each fixing assembly 250a includes a locking component 252a and an elastic component 254a sleeved on the locking component 252a. The elastic component 254a is a non-metal material and is a material with low thermal conductivity, such as rubber or other suitable materials, and is not limited thereto. As shown in FIG. 2C, the locking component 252a of the at least one fixing assembly 250a sequentially penetrates through the assembling element 220, the elastic component 254a and the housing 210, a portion of the elastic component 254a is located between the housing 210 and the assembling element 220, and the housing 210 and the assembling element 220 are respectively in contact with the elastic component 254a, such that the assembling element 220 is assembled on the housing 210 in a non-direct contact mode by means of the fixing assembly 250a, to reduce the heat transmission from the housing 210 to the assembling element 220.

Furthermore, the light valve 230 of this embodiment is disposed on the assembling element 220 and includes a base 232 and an imaging element 234. The imaging element 234 is fixed on the base 232. The base 232 bears against the assembling element 220, and the imaging element 234 includes an imaging surface 235. The imaging surface 235 of the imaging element 234 is aligned to the opening 222 of the assembling element 220 and the assembly hole 212 of the housing 210. The imaging surface 235 of the imaging element 234 is located on the transmission path of the illuminating beam L1 (referring to FIG. 1) and is used for modulating the illuminating beam L1 into the image beam L2 (referring to FIG. 1). The housing 210, the assembling element 220 and the light valve 230 define a chamber C, and the imaging surface 235 of the light valve 230 faces the inside of the chamber C. The optical engine module 200a of this embodiment can further include a total internal reflection prism (TIR Prism) 280, where the total internal reflection prism 280 is disposed in the chamber C and is corresponding to the imaging element 234. Further, referring to all of FIG. 1, FIG. 2A, FIG. 2B and FIG. 2C, a closed space is formed in the chamber C between the total internal reflection prism 280 and the light valve 230 and is used for preventing dust from entering a place between the total internal reflection prism 280 and the light valve 230, so as to maintain better imaging quality. In addition, a portion of the lens 300 is, for example, disposed in the housing 210 of the optical engine module 200a, and a closed space is also formed in the chamber C between the total internal reflection prism 280 and the lens 300 and is used for preventing dust from entering, so as to reduce image brightness degradation.

It is worth mentioning that the assembling element 220 of this embodiment is assembled on the housing 210 in a non-direct contact mode, i.e., the assembling element 220 is not in direct contact with the housing 210 by means of the fixing assembly 250a, thereby reducing the heat transmission from the housing 210 to the light valve 230, so as to prevent the temperature of the light valve 230 from rising.

Referring to FIG. 2A, the first heat exchange assembly 240 of this embodiment is disposed on the assembling element 220 and includes at least one first heat conduction component 242 (two first heat conduction components are schematically drawn) and a first heat dissipation fin set 244. The first heat dissipation fin set 244 is located outside the housing 210, i.e., located outside the chamber C and not in contact with the housing 210, and the first heat conduction component 242 extends from the assembling element 220 to the outside of the housing 210 and is connected with the first heat dissipation fin set 244. As shown in FIG. 2A, one end of each first heat conduction component 242 is connected to the assembling element 220, and the other end is connected to the first heat dissipation fin set 244. Herein, the first heat exchange assembly 240 is, for example, an air-cooled heat exchange assembly or a liquid-cooled heat exchange assembly, and the first heat conduction component 242 is, for example, a heat pipe, but is not limited thereto.

To further improve the heat dissipation effect, referring to FIG. 2C, the optical engine module 200a of this embodiment can further include at least one thermoelectric cooler 260 (two thermoelectric coolers are schematically drawn), where the thermoelectric cooler 260 is disposed between the first heat conduction component 242 of the first heat exchange assembly 240 and the assembling element 220. More specifically, the thermoelectric cooler 260 of this embodiment includes a cold surface 262 and a hot surface 264 at opposite sides, the cold surface 262 of the thermoelectric cooler 260 is connected with the assembling element 220, and the hot surface 264 of the thermoelectric cooler 260 is connected with the first heat conduction component 242. The heat generated by the light valve 230 can be transmitted to the first heat dissipation fin set 244 sequentially by means of the assembling element 220, the thermoelectric cooler 260 and the first heat conduction component 242 so as to be dissipated.

Furthermore, to fix the first heat conduction component 242 and enable the thermoelectric cooler 260 to operate normally, referring to both FIG. 2A and FIG. 2C, the optical engine module 200a of this embodiment can include a heat conduction plate 270, where the heat conduction plate 270 is disposed on the assembling element 220 and is located between the first heat conduction component 242 of the first heat exchange assembly 240 and the assembling element 220. The first heat conduction component 242 of the first heat exchange assembly 240 can be fixed on the heat conduction plate 270 by means of a welding mode. The thermoelectric cooler 260 is located between the heat conduction plate 270 and the assembling element 220, where the area of the heat conduction plate 270 is greater than the area of the thermoelectric cooler 260, so that the hot surface 264 of the thermoelectric cooler 260 can be in full contact with the heat conduction plate 270 to exert functions. The heat generated by the light valve 230 can be transmitted to the first heat dissipation fin set 244 sequentially by means of the assembling element 220, the thermoelectric cooler 260, the heat conduction plate 270 and the first heat conduction component 242 so as to be dissipated.

In brief, in the optical engine module 200a of this embodiment, the assembling element 220 is assembled on the housing 210 in a non-direct contact mode, thereby reducing the heat transmission from the housing 210 to the light valve 230. The base 232 of the light valve 230 bears against the assembling element 220, and the first heat exchange assembly 240 is disposed on the assembling element 220. Therefore, the heat generated during action of the light valve 230 can be transmitted to the outside by means of the assembling element 220 and the first heat conduction component 242 and the first heat dissipation fin set 244 of the first heat exchange assembly 240, thereby effectively improving the heat dissipation effect on the front end of the light valve 230. Thus, the projector 10 adopting the optical engine module 200a of this embodiment (referring to FIG. 1) has better projection quality.

It should be noted herein that the following embodiments follow the element symbols and partial contents of the foregoing embodiments, identical symbols are adopted to represent identical or similar elements, and the explanation of the same technical contents is omitted. The explanation of the omitted portion can refer to the foregoing embodiments, and will not be repeated in the following embodiments.

Figure 3A:
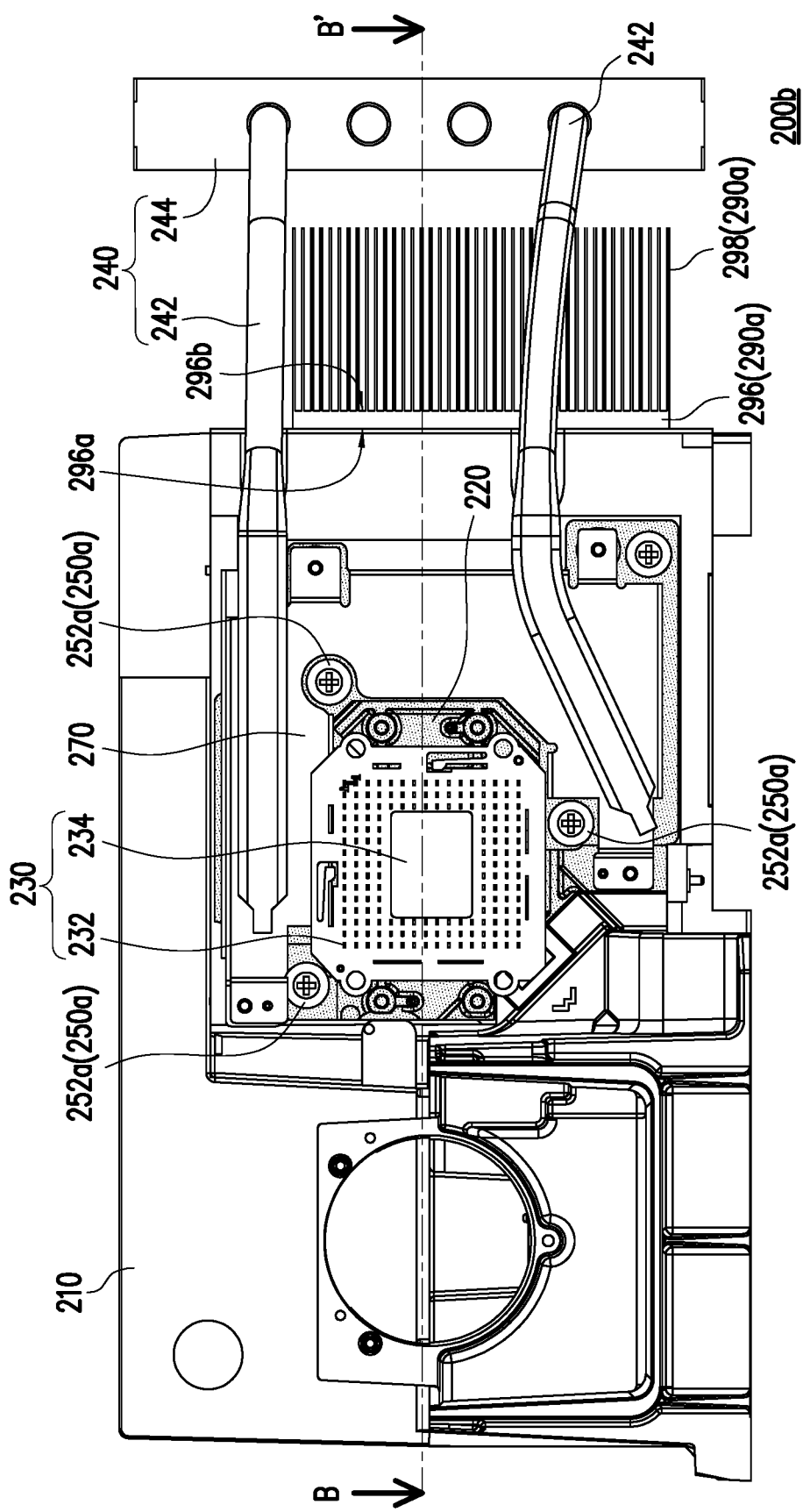
FIG. 3A is a top view of an optical engine module according to another embodiment of the present invention.
Figure 3B:
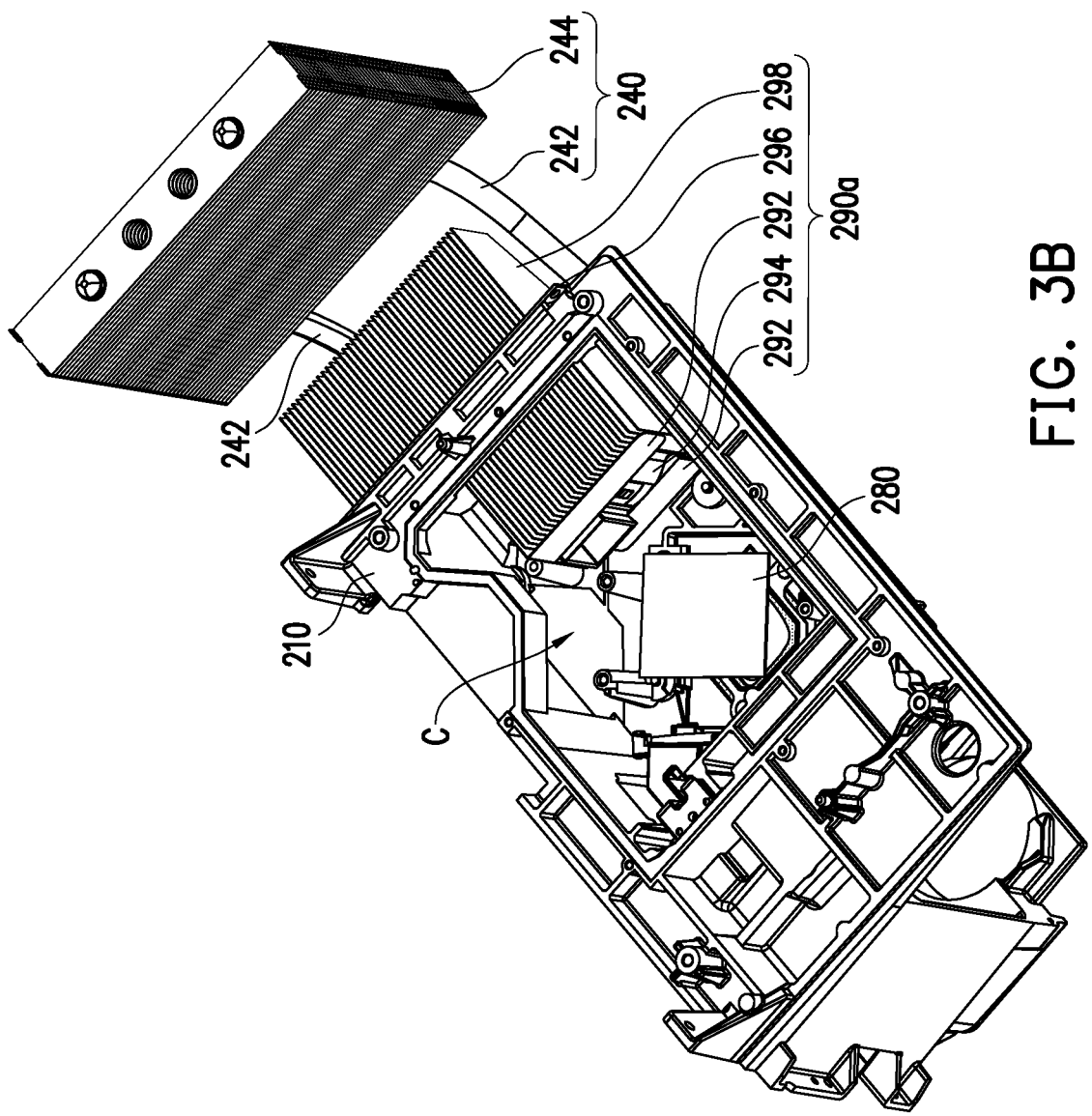
FIG. 3B is a three-dimensional bottom view of the optical engine module in FIG. 3A.
Figure 3C:
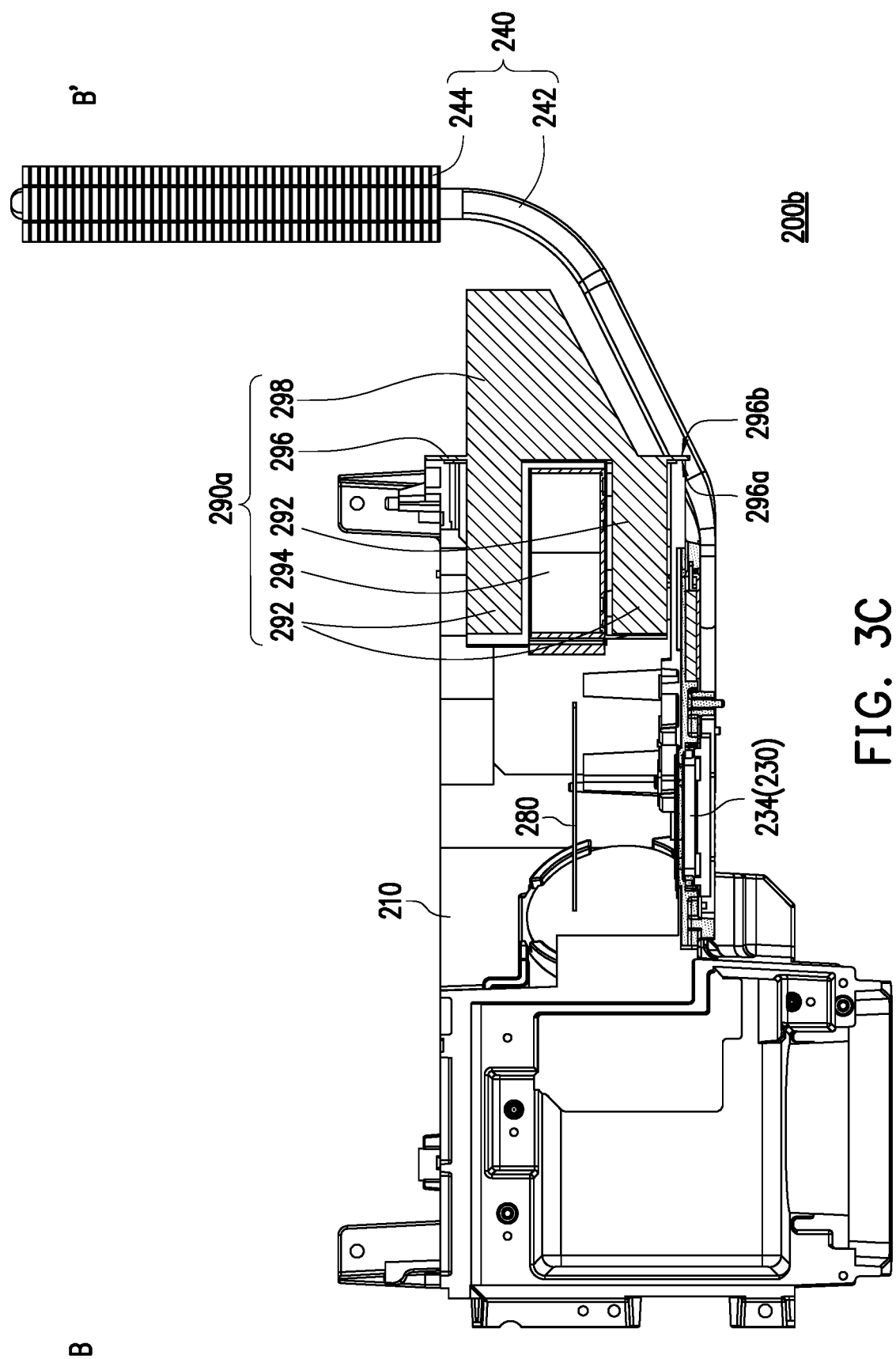
FIG. 3C is a cross-sectional view along a line B-B' in FIG. 3A.
Figure 3D:
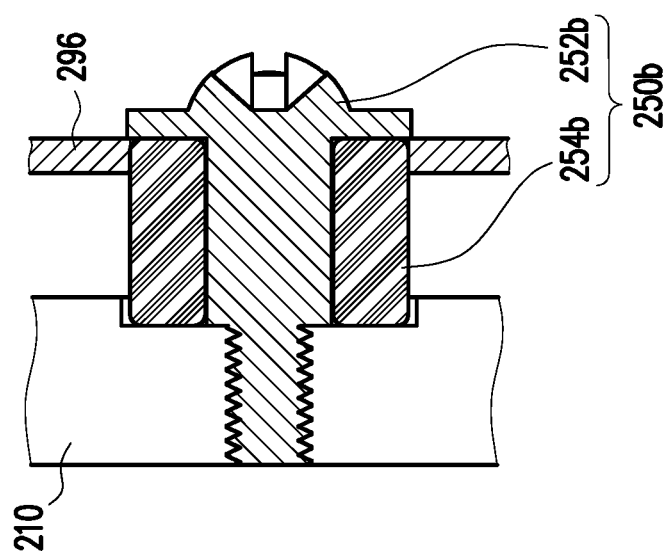
FIG. 3D is a partially amplified schematic view along the optical engine module in FIG. 3B.

FIG. 3A is a top view of an optical engine module according to another embodiment of the present invention. FIG. 3B is a three-dimensional bottom view of the optical engine module in FIG. 3A. FIG. 3C is a cross-sectional view along a line B-B' in FIG. 3A. FIG. 3D is a partially amplified schematic view along the optical engine module in FIG. 3B. For convenience of explanation, a portion of a housing 210 is omitted in FIG. 3B.

Referring to both FIG. 2B and FIG. 3B at first, an optical engine module 200b of this embodiment is similar to the optical engine module 200a in FIG. 2B, and is different from the optical engine module 200a as follows. The optical engine module 200b of this embodiment further includes a second heat exchange assembly 290a, where the second heat exchange assembly 290a includes at least one second heat dissipation fin set 292, a first fan 294, a second heat conduction component 296 and a third heat dissipation fin set 298. The second heat dissipation fin set 292 and the first fan 294 are disposed in the chamber C, the second heat conduction component 296 and the third heat dissipation fin 298 are located outside the chamber C, and the third heat dissipation fin set 298 is disposed outside the housing 210. Herein, the second heat exchange assembly 290a is, for example, an air-cooled heat exchange assembly or a liquid-cooled heat exchange assembly, and the second heat conduction component 296 is, for example, a heat pipe or a metal plate, but is not limited thereto.

Further, referring to all of FIG. 3A, FIG. 3B and FIG. 3C, the number of the at least one second heat dissipation fin set 292 of the second heat exchange assembly 290a is two, and the first fan 294 of the second heat exchange assembly 290a is located between the two second heat dissipation fin sets 292, so as to drive an air flow in the housing 210. The second heat dissipation fin sets 292 and the first fan 294 are disposed beside one side of the total internal reflection prism 280. The second heat conduction component 296 has a first surface 296a and a second surface 296b which are opposite to each other, the first surface 296a faces, for example, towards the direction of the inside of the chamber C, and the second surface 296b faces, for example, towards the direction of the outside of the chamber C. The second heat dissipation fin sets 292 are connected with the first surface 296a of the second heat conduction component 296, and the third heat dissipation fin set 298 is connected with the second surface 296b of the second heat conduction component 296. Namely, the second heat dissipation fin sets 292 and the third heat dissipation fin set 298 are respectively connected with the second heat conduction component 296. The third heat dissipation fin set 298 is located between the housing 210 and the first heat dissipation fin set 244 of the first heat exchange assembly 240.

Especially, the second heat conduction component 296 of this embodiment is assembled on the housing 210 in a non-direct contact mode. More specifically, referring to FIG. 3C and FIG. 3D, the optical engine module 200b of this embodiment further includes at least one fixing assembly 250b, where each fixing assembly 250b includes a locking part 252b and an elastic part 254b sleeved on the locking part 252b. The elastic part 254b is a non-metal material and is a material with low thermal conductivity, such as rubber or other suitable materials, and is not limited thereto. As shown in FIG. 3D, the locking part 252b of the at least one fixing assembly 250b sequentially penetrates through the second heat conduction component 296, the elastic part 254b and the housing 210, and a portion of the elastic part 254b is located between the housing 210 and the second heat conduction component 296, so that the second heat conduction component 296 is assembled on the housing 210 in a non-direct contact mode by means of the fixing assembly 250b.

When the second heat exchange assembly 290a is in operation, the first fan 294 drives the air flow in the housing 210 to enable the low-temperature air flow to cool the total internal reflection prism 280, the high-temperature air flow flowing through the total internal reflection prism 280 flows through the second heat dissipation fin sets 292, the second heat dissipation fin sets 292 absorb heat of the high-temperature air flow, and then, the heat is transmitted to the third heat dissipation fin set 298 outside the housing 210 by means of the second heat conduction component 296 so as to be dissipated. The external air flow can flow through the third heat dissipation fin set 298 to take away the heat conducted out of the chamber C, thereby effectively reducing the air temperature in the chamber C.

Preferably, the temperature of the third heat dissipation fin set 298 of the second heat exchange assembly 290a is lower than the temperature of the first heat dissipation fin set 244 of the first heat exchange assembly 240. The cooling air flower outside the housing 210 can sequentially flow through the third heat dissipation fin set 298 and the first heat dissipation fin set 244. In other words, the cooling air flow outside the housing 210 firstly flows through the third heat dissipation fin set 298 at a lower temperature and then flows through the first heat dissipation fin set 244 at a higher temperature. By means of the design of such a flow field, the light valve 230 and the total internal reflection prism 280 can be cooled at the same time with maximum heat dissipation efficiency.

In brief, in the design of the optical engine module 200b of this embodiment, the heat dissipation effect on the front end of the light valve 230 can be improved by means of the assembling element 220 and the first heat exchange assembly 240, and furthermore, the total internal reflection prism 280 can be subjected to heat dissipation by means of the second heat exchange assembly 290a. Therefore, the optical engine module 200b of this embodiment can perform heat dissipation on both the light valve 230 and the total internal reflection prism 280, and has a better heat dissipation effect.

Figure 3E:
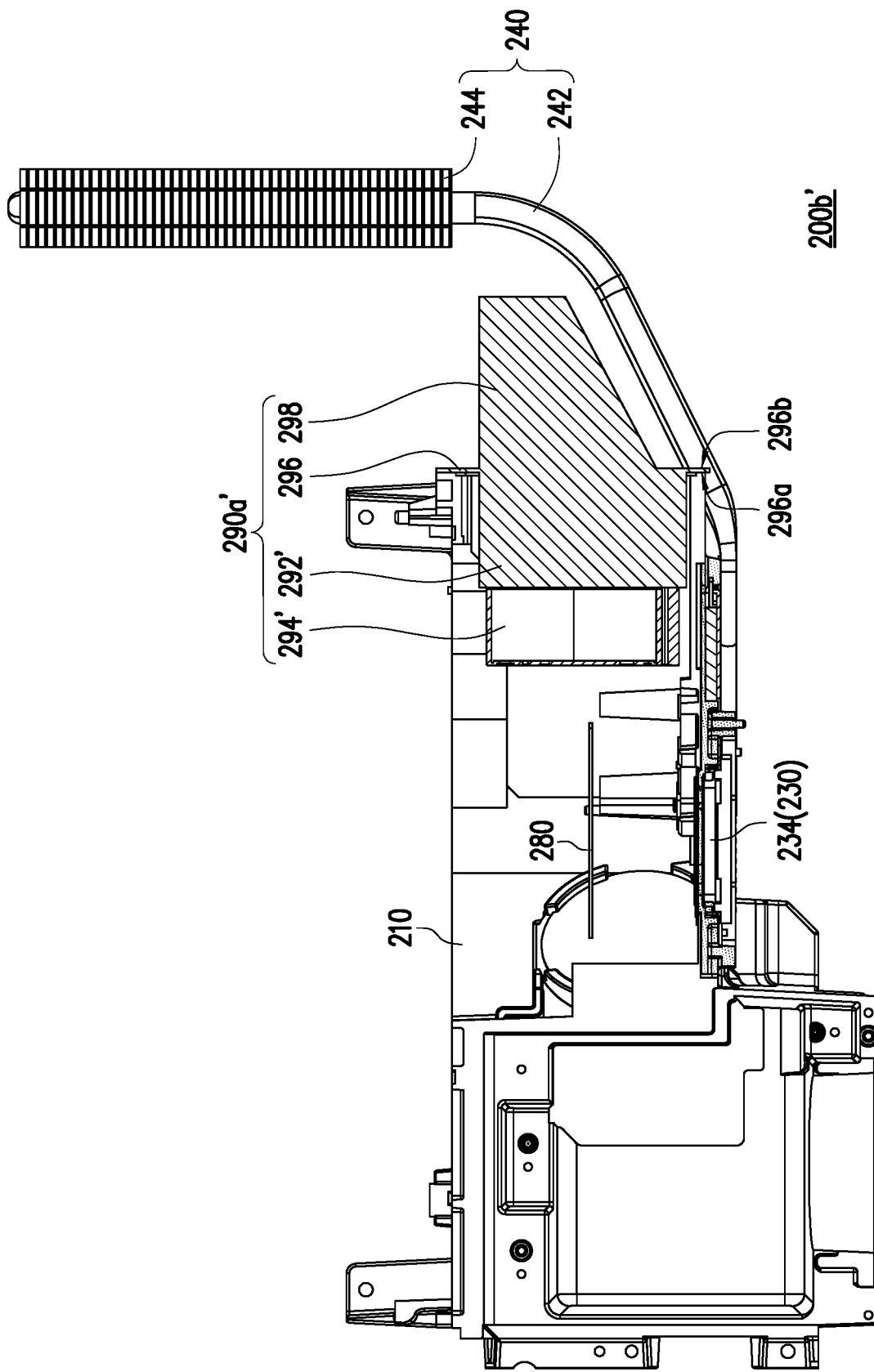
FIG. 3E is a cross-sectional schematic view of a second heat exchange assembly according to another embodiment of the present invention.

FIG. 3E is a cross-sectional schematic view of a second heat exchange assembly according to another embodiment of the present invention. For convenience of explanation, a portion of a housing 210 is omitted in FIG. 3E. Referring to FIG. 3E, the number of at least one second heat dissipation fin set 292' of the second heat exchange assembly 290a' of an optical engine module 200b' is one, a first fan 294' of the second heat exchange assembly 290a' is located at one side of the second heat dissipation fin set 292', and the first fan 294' is disposed between the total internal reflection prism 280 and the second heat dissipation fin set 292', to drive an air flow in the housing 210 and perform heat dissipation on the total internal reflection prism 280. The heat dissipation mode of the second heat exchange assembly in FIG. 3E is similar to that of the second heat exchange assembly in FIG.

3B, and part of the explanation can refer to the foregoing embodiments, and thus is omitted herein.

Figure 4:
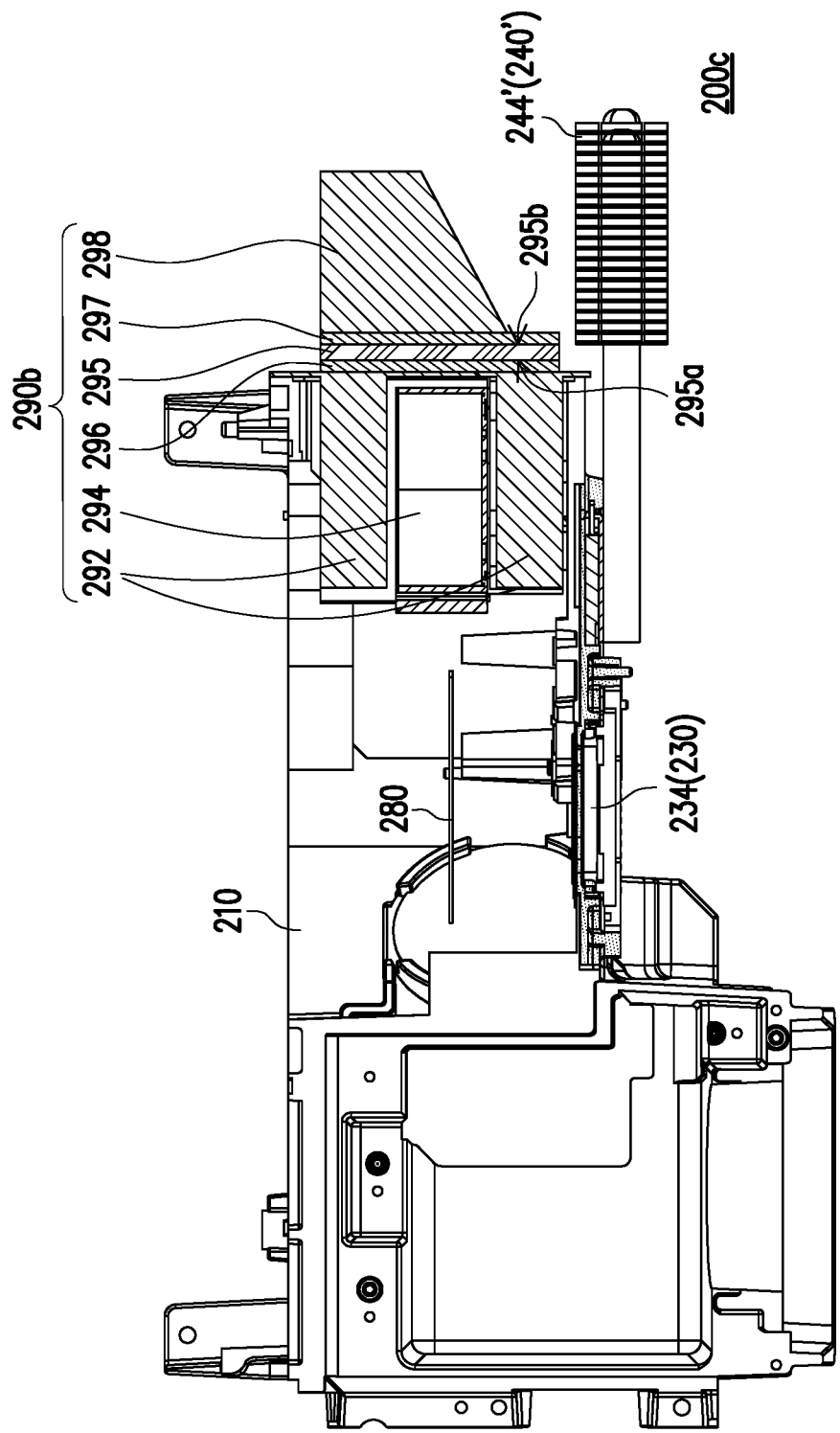
FIG. 4 is a cross-sectional schematic view of an optical engine module according to another embodiment of the present invention.

FIG. 4 is a cross-sectional schematic view of an optical engine module according to another embodiment of the present invention. Referring to both FIG. 2B and FIG. 4, an optical engine module 200c of this embodiment is similar to the optical engine module 200b in FIG. 3B, and is different from the optical engine module 200b as follows: a second heat exchange assembly 290b of this embodiment further includes a thermoelectric cooler 295 and a third heat conduction component 297. In detail, the thermoelectric cooler 295 is located between the second heat conduction component 296 and the third heat conduction component 297. The third heat conduction component 297 is located between the thermoelectric cooler 295 and the third heat dissipation fin set 298. The second heat conduction component 296 is connected with a cold surface 295a of the thermoelectric cooler 295, and the third heat dissipation fin set 298 is connected with a hot surface 295b of the thermoelectric cooler 295. And the cold surface 295a and the hot surface 295b are disposed at two opposite sides of the thermoelectric cooler 295. Namely, the third heat conduction component 297 is in contact with the hot surface 295b of the thermoelectric cooler 295. The second heat dissipation fin set 292 absorbs the heat of a high-temperature air flow in the chamber C, and then, the heat is transmitted to the third heat dissipation fin set 298 outside the housing 210 sequentially by means of the second heat conduction component 296, the thermoelectric cooler 295 and the third heat conduction component 298 so as to be dissipated.

Preferably, the temperature of the third heat dissipation fin set 298 of the second heat exchange assembly 290b is lower than the temperature of the first heat dissipation fin set 244' of the first heat exchange assembly 240'. The cooling air flow outside the housing 210 can sequentially flow through the third heat dissipation fin set 298 and the first heat dissipation fin set 244'. In other words, the cooling air flow outside the housing 210 firstly flows through the third heat dissipation fin set 298 at a lower temperature and then flows through the first heat dissipation fin set 244' at a higher temperature. By means of the design of such a flow field, the light valve 230 and the total internal reflection prism 280 can be cooled at the same time with maximum heat dissipation efficiency.

Figure 5A:
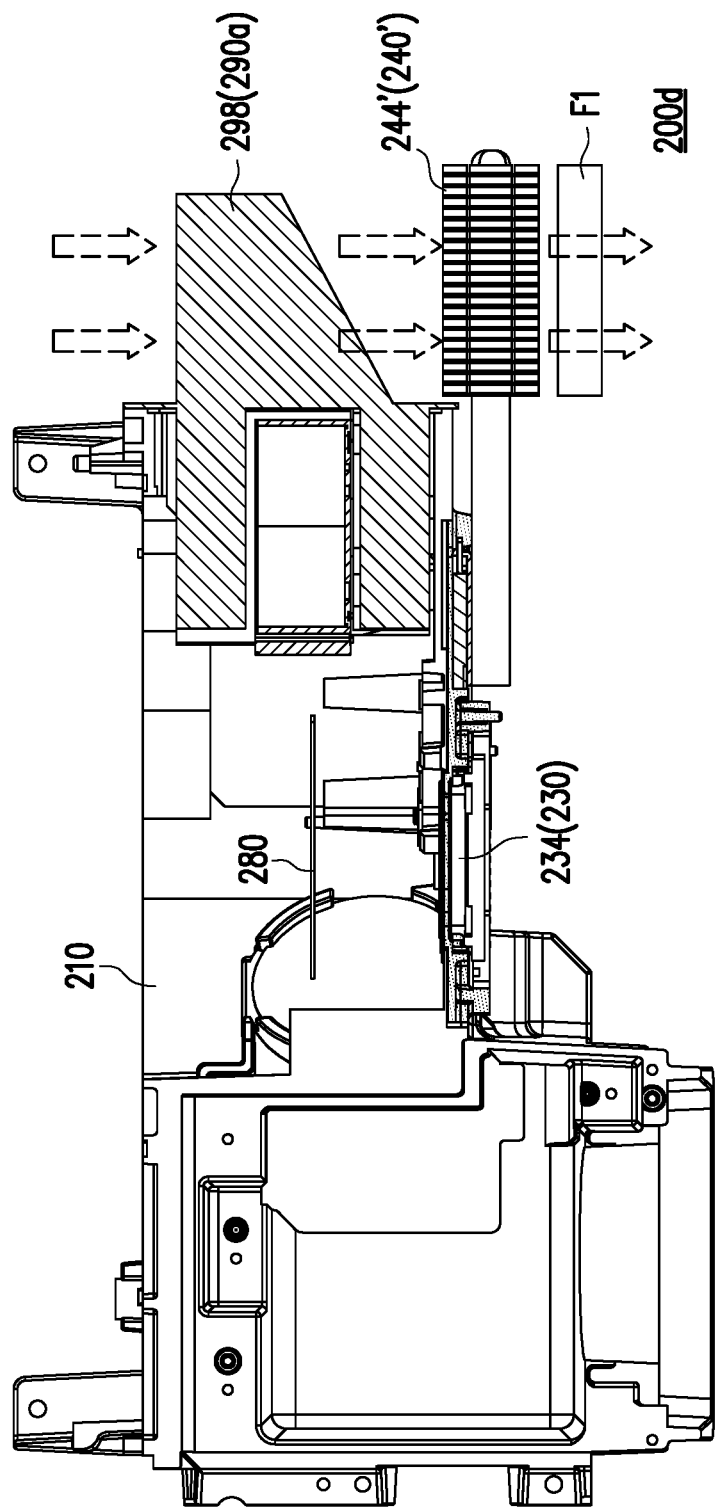
FIG. 5A is a cross-sectional schematic view of an optical engine module according to another embodiment of the present invention.

FIG. 5A is a cross-sectional schematic view of an optical engine module according to another embodiment of the present invention. Referring to both FIG. 2B and FIG. 5A, an optical engine module 200d of this embodiment is similar to the optical engine module 200b in FIG. 3B, and is different from the optical engine module 200b as follows: the optical engine module 200d of this embodiment further includes a second fan F1, where the second fan F1 is disposed at one side of the first heat dissipation fin set 244' of the first heat exchange assembly 240'. The first heat dissipation fin set 244' of the first heat exchange assembly 240' is located between the second fan F1 and the third heat dissipation fin set 298 of the second heat exchange assembly 290a. The second fan F1 drives the cooling air flower outside the housing 210, thereby increasing the heat dissipation efficiency of the optical engine module 200d.

Figure 5B:
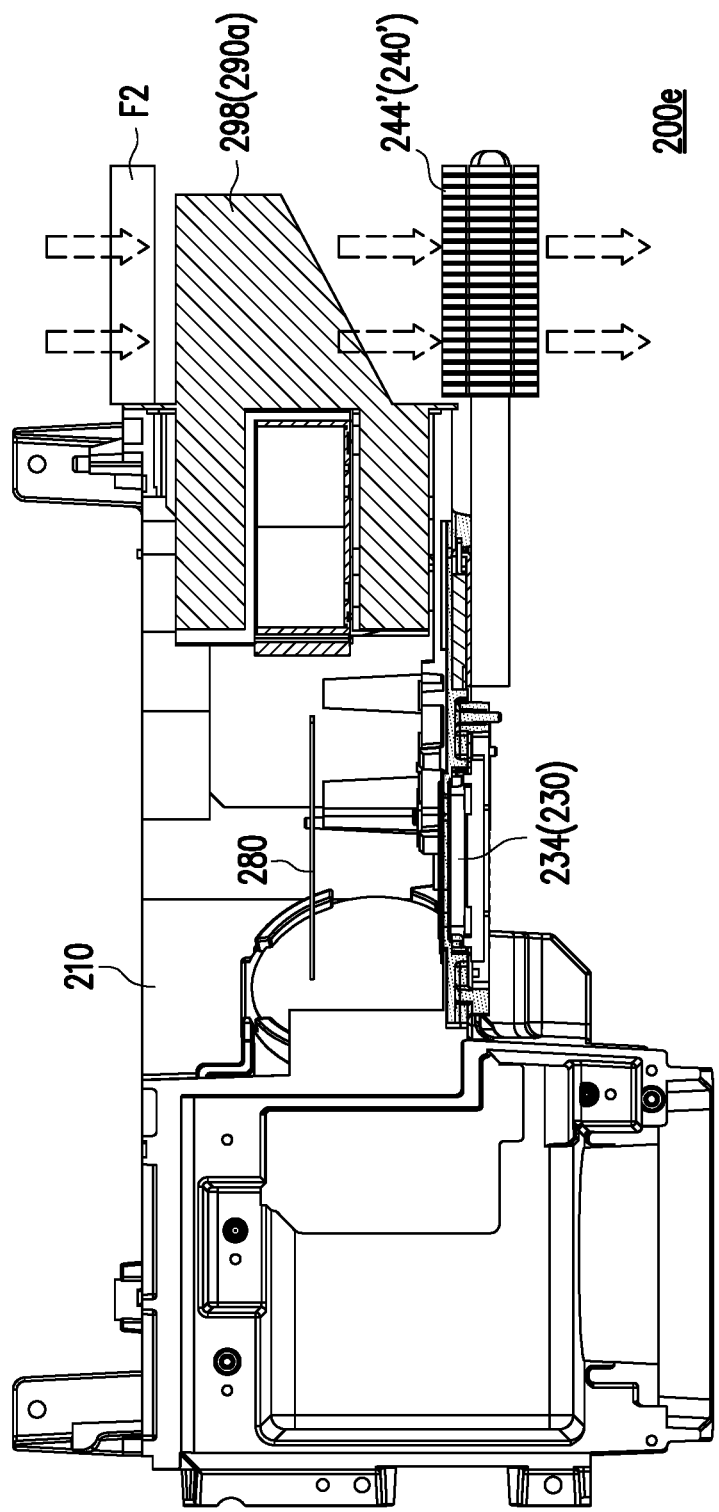
FIG. 5B is a cross-sectional schematic view of an optical engine module according to another embodiment of the present invention.

FIG. 5B is a cross-sectional schematic view of an optical engine module according to another embodiment of the present invention. Referring to both FIG. 2B and FIG. 5B, an optical engine module 200e of this embodiment is similar to the optical engine module 200b in FIG. 3B, and is different from the optical engine module 200b as follows: the optical engine module 200e of this embodiment further includes a second fan F2, where the second fan F2 is disposed at one side of the third heat dissipation fin set 298 of the second heat exchange assembly 290a. The third heat dissipation fin set 298 of the second heat exchange assembly 290a is located between the second fan F2 and the first heat dissipation fin set 244' of the first heat exchange assembly 240'. The second fan F2 drives the cooling air flow outside the housing 210, thereby increasing the heat dissipation efficiency of the optical engine module 200e.

Figure 5C:
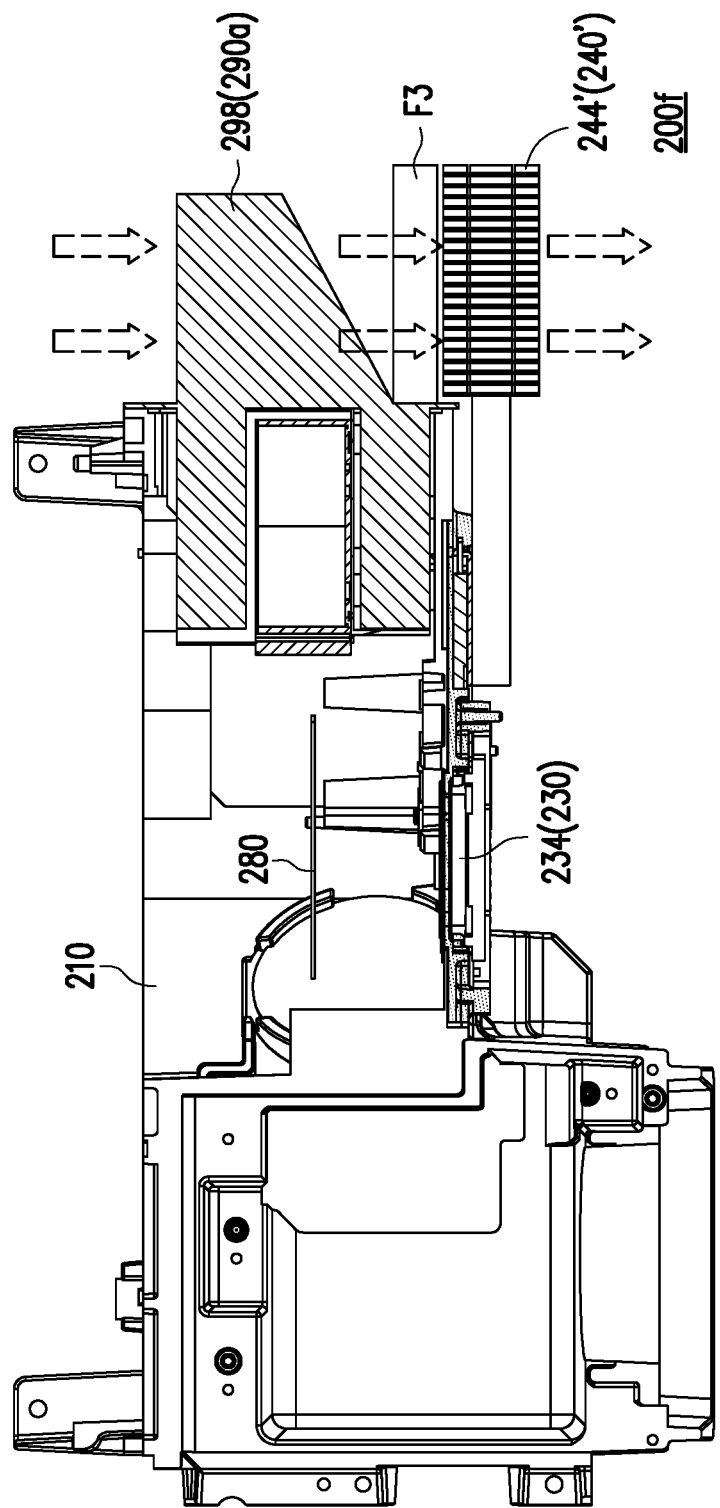
FIG. 5C is a cross-sectional schematic view of an optical engine module according to another embodiment of the present invention.

FIG. 5C is a cross-sectional schematic view of an optical engine module according to another embodiment of the present invention. Referring to both FIG. 2B and FIG. 5C, an optical engine module 200f of this embodiment is similar to the optical engine module 200b in FIG. 3B, and is different from the optical engine module 200b as follows: the optical engine module 200f of this embodiment further includes a second fan F3, where the second fan F3 is disposed between the first heat dissipation fin set 244' of the first heat exchange assembly 240' and the third heat dissipation fin set 298 of the second heat exchange assembly 290a. The second fan F3 drives the cooling air flow outside the housing 210, thereby increasing the heat dissipation efficiency of the optical engine module 200f.

In brief, in the embodiments of the invention, the second fans F1, F2 and F3 are selectively located downstream of the first heat dissipation fin set 244', upstream of the third heat dissipation fin set 298 or between the first heat dissipation fin set 244' and the third heat dissipation fin set 298. The cooling air flow generated by the second fan F1, F2 or F3 firstly flows through the third heat dissipation fin set 298 at a lower temperature and then flows through the first heat dissipation fin set 244' at a higher temperature. By means of the design of such a flow field, the light valve 230 and the total internal reflection prism 280 can be cooled at the same time with maximum heat dissipation efficiency.

In conclusion, the embodiment of the invention at least has one of the following advantages or effects. In the optical engine module of the present invention, the assembly is assembled on the housing in a non-direct contact mode, thereby reducing the heat transmission from the housing to the light valve. The base of the light valve bears against the assembling element, and the first heat exchange assembly is disposed on the assembling element. Therefore, the heat generated during action of the light valve can be transmitted to the outside by means of the assembling element and the first heat conduction component and the first heat dissipation fin set of the first heat exchange assembly, thereby effectively improving the heat dissipation effect on the front end of the light valve. In another embodiment of the invention, the optical engine module can also perform heat dissipation on the total internal reflection prism in the chamber by means of the second heat exchange assembly, to achieve heat dissipation on both the light valve and the total internal reflection prism, and the heat dissipation effect is better. Furthermore, the projector adopting the optical engine module of the present invention has better projection quality.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An optical engine module, comprising a housing, an assembling element, a light valve and a first heat exchange assembly, wherein
    the housing has an assembly hole;
    the assembling element has an opening and is assembled on the housing in a non-direct contact mode, wherein the opening is corresponding to the assembly hole;
    the light valve is disposed on the assembling element and comprises a base and an imaging element, the imaging element comprises an imaging surface, the base bears against the assembling element, the imaging surface of the imaging element faces the opening of the assembling element, and the housing, the assembling element and the light valve define a chamber; and
    the first heat exchange assembly is disposed on the assembling element and comprises at least one first heat conduction component and a first heat dissipation fin set, the first heat dissipation fin set is located outside the housing, and the at least one first heat conduction component extends from the assembling element to the outside of the housing and is connected with the first heat dissipation fin set.

2. The optical engine module according to claim 1, further comprising:
    at least one fixing assembly comprising a locking component and an elastic component sleeved on the locking component, wherein the elastic component is a non-metal material, and a portion of the elastic component is located between the housing and the assembling element, so that the assembling element is assembled on the housing in a non-direct contact mode by means of the at least one fixing assembly.

3. The optical engine module according to claim 1, further comprising:
    at least one thermoelectric cooler, disposed between the at least one first heat conduction component of the first heat exchange assembly and the assembling element, wherein a cold surface of the at least one thermoelectric cooler is connected with the assembling element, and a hot surface of the at least one thermoelectric cooler is connected with the at least one first heat conduction component.

4. The optical engine module according to claim 3, further comprising:
    a heat conduction plate, disposed on the assembling element and located between the at least one first heat conduction component of the first heat exchange assembly and the assembling element, wherein the at least one thermoelectric cooler is located between the heat conduction plate and the assembling element.

5. The optical engine module according to claim 1, further comprising:
    a total internal reflection prism, disposed in the chamber and configured corresponding to the imaging element.

6. The optical engine module according to claim 1, further comprising:
    a second heat exchange assembly, comprising at least one second heat dissipation fin set, a first fan, a second heat conduction component and a third heat dissipation fin set, wherein the at least one second heat dissipation fin set and the first fan are disposed in the chamber, the second heat conduction component and the third heat dissipation fin set are located outside the housing, and the at least one second heat dissipation fin set and the third heat dissipation fin set are respectively connected with the second heat conduction component.

7. The optical engine module according to claim 6, further comprising:
    a total internal reflection prism, disposed in the chamber and configured corresponding to the imaging element, wherein the first fan is located at one side of the at least one second heat dissipation fin set, and the at least one second heat dissipation fin set and the first fan are disposed beside one side of the total internal reflection prism.

8. The optical engine module according to claim 6, wherein the second heat conduction component has a first surface and a second surface opposite to each other, the at least one second heat dissipation fin set is connected with the first surface of the second heat conduction component, the third heat dissipation fin set is connected with the second surface of the second heat conduction component, and the second heat conduction component is assembled on the housing in a non-direct contact mode.

9. The optical engine module according to claim 8, further comprising:
    at least one fixing assembly, comprising a locking component and an elastic component sleeved on the locking component, wherein the elastic component is a non-metal material, and a portion of the elastic component is located between the housing and the second heat conduction component, so that the second heat conduction component is assembled on the housing in a non-direct contact mode by means of the at least one fixing assembly.

10. The optical engine module according to claim 6, further comprising:
    a second fan, disposed at one side of the first heat dissipation fin set of the first heat exchange assembly, wherein the first heat dissipation fin set of the first heat exchange assembly is located between the second fan and the third heat dissipation fin set of the second heat exchange assembly.

11. The optical engine module according to claim 6, further comprising:

a second fan, disposed at one side of the third heat dissipation fin set of the second heat exchange assembly, wherein the third heat dissipation fin set of the second heat exchange assembly is located between the second fan and the first heat dissipation fin set of the first heat exchange assembly.

12. The optical engine module according to claim 6, further comprising:
a second fan, disposed between the first heat dissipation fin set of the first heat exchange assembly and the third heat dissipation fin set of the second heat exchange assembly.

13. The optical engine module according to claim 6, wherein a temperature of the third heat dissipation fin set of the second heat exchange assembly is lower than a temperature of the first heat dissipation fin set of the first heat exchange assembly, and a cooling air flow outside the housing sequentially flows through the third heat dissipation fin set and the first heat dissipation fin set.

14. The optical engine module according to claim 6, wherein the second heat exchange assembly further comprises a thermoelectric cooler and a third heat conduction component, the thermoelectric cooler is located between the second heat conduction component and the third heat conduction component, and the third heat conduction component is located between the thermoelectric cooler and the third heat dissipation fin set.

15. The optical engine module according to claim 14, wherein the second heat conduction component is connected with a cold surface of the thermoelectric cooler, and the third heat dissipation fin set is connected with a hot surface of the thermoelectric cooler.

16. The optical engine module according to claim 6, wherein the first heat exchange assembly and the second heat exchange assembly comprise an air-cooled heat exchange assembly or a liquid-cooled heat exchange assembly.

17. A projector, comprising an illuminating system, an optical engine module and a lens, wherein
the illuminating system is used for providing an illuminating beam;
the optical engine module comprises a housing, an assembling element, a light valve and a first heat exchange assembly, wherein
the housing has an assembly hole;
the assembling element has an opening and is assembled on the housing in a non-direct contact mode, wherein the opening is corresponding to the assembly hole;
the light valve is disposed on the assembling element and comprises a base and an imaging element, wherein the base bears against the assembling element, the imaging element comprises an imaging surface, the imaging surface of the imaging element faces the opening of the assembling element, the imaging element is located on a transmission path of the illuminating beam and is used for modulating the illuminating beam into an image beam, and the housing, the assembling element and the light valve define a chamber; and
the first heat exchange assembly is disposed on the assembling element and comprises at least one first heat conduction component and a first heat dissipation fin set, and the first heat dissipation fin set is located outside the housing, wherein the at least one first heat conduction component extends from the assembling element to the outside of the housing and is connected with the first heat dissipation fin set; and
the lens is disposed on a transmission path of the image beam and is used for projecting the image beam out of the projector to form a projecting beam.

18. The projector according to claim 17, wherein the optical engine module further comprises:
a second heat exchange assembly, comprising at least one second heat dissipation fin set, a first fan, a second heat conduction component and a third heat dissipation fin set, wherein the at least one second heat dissipation fin set and the first fan are disposed in the chamber, the second heat conduction component and the third heat dissipation fin set are located outside the housing, and the at least one second heat dissipation fin set and the third heat dissipation fin set are respectively connected with the second heat conduction component.

19. The projector according to claim 18, wherein the optical engine module further comprises: a total internal reflection prism, disposed in the chamber and is located on the transmission path of the image beam from the imaging element, wherein the first fan is located at one side of the at least one second heat dissipation fin set, and the at least one second heat dissipation fin set and the first fan are disposed beside one side of the total internal reflection prism.

20. The projector according to claim 18, wherein a temperature of the third heat dissipation fin set of the second heat exchange assembly is lower than a temperature of the first heat dissipation fin set of the first heat exchange assembly, and a cooling air flow outside the housing sequentially flows through the third heat dissipation fin set and the first heat dissipation fin set.

* * * * *